United States Patent [19]
Paiva

[11] 3,965,419
[45] June 22, 1976

[54] CATHODE RAY TUBE METERS
[75] Inventor: Micheal O. Paiva, Binghamton, N.Y.
[73] Assignee: McIntosh Laboratory Inc., Binghamton, N.Y.
[22] Filed: July 18, 1974
[21] Appl. No.: 489,477

[52] U.S. Cl............................ 324/121 R; 324/103 P
[51] Int. Cl.² .................. G01R 13/28; G01R 19/04
[58] Field of Search ................ 324/121, 103 P, 114, 324/77 A

[56] References Cited
UNITED STATES PATENTS

| | | | |
|---|---|---|---|
| 2,465,355 | 3/1949 | Cook ................................ | 324/77 A |
| 3,248,650 | 4/1966 | Bialkowski et al.............. | 324/121 R |
| 3,345,625 | 10/1967 | Russell et al........................ | 324/121 |
| 3,354,392 | 11/1967 | Newell ............................ | 324/121 R |
| 3,474,438 | 10/1969 | Lauher............................ | 324/121 R |

Primary Examiner—R. V. Rolinec
Assistant Examiner—Ernest F. Karlsen
Attorney, Agent, or Firm—Elliott I. Pollock

[57] ABSTRACT

A cathode ray tube meter, which may be developed as a VU meter, provides visual representation of the signal levels in each channel of plural signal channels. The signal channels may be the signal channels in a multi-channel audio system. The amplitude of a sawtooth waveform signal from a sawtooth waveform signal generator, which also controls the vertical sweep of an oscilloscope, is compared sequentially with individual d.c. signals developed by respective peak detectors, one being associated with each signal channel, to provide a control signal whenever the amplitude of the sawtooth waveform signal exceed the level of that particular one of the d.c. signals with which it is being compared at any given time. The control signal thus produced is used either as a blanking signal for the vertical sweep or as a signal for effecting the resetting of the sawtooth wave generator. A second sweep signal having a plurality of discrete levels controls the horizontal sweep of the oscilloscope. The horizontal sweep is synchronized so that each vertical trace appearing on the screen of the oscilloscope relates to an individual one of the signal channels, its length corresponding to the amplitude of the signal present.

9 Claims, 4 Drawing Figures

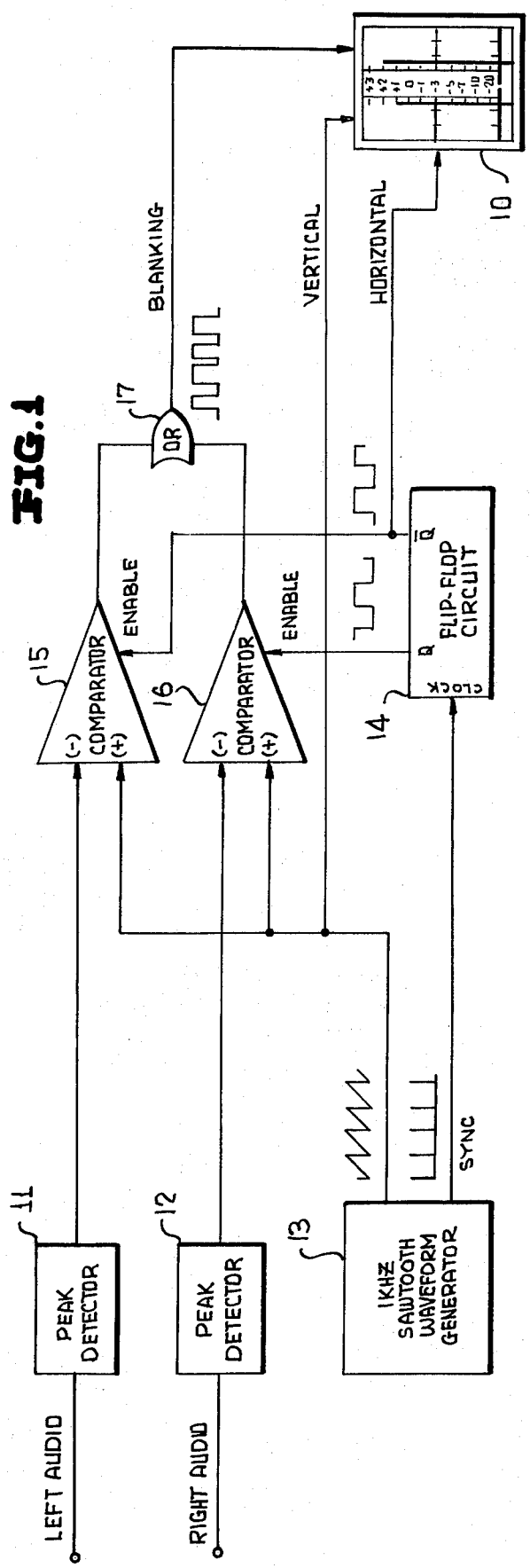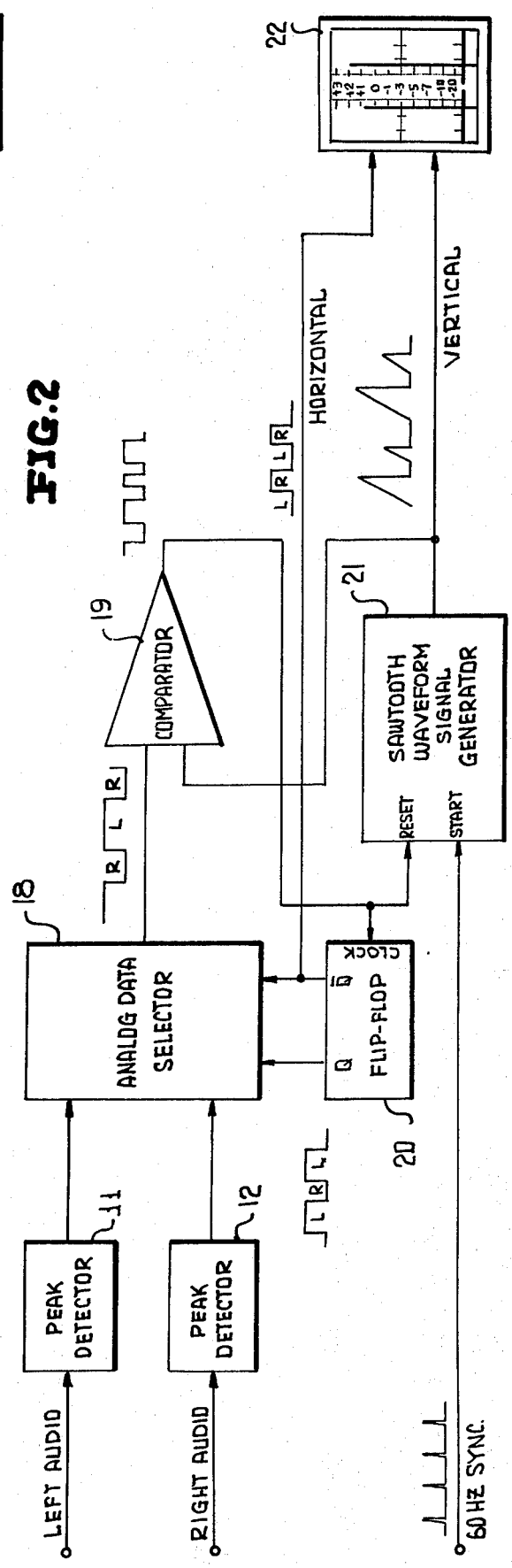

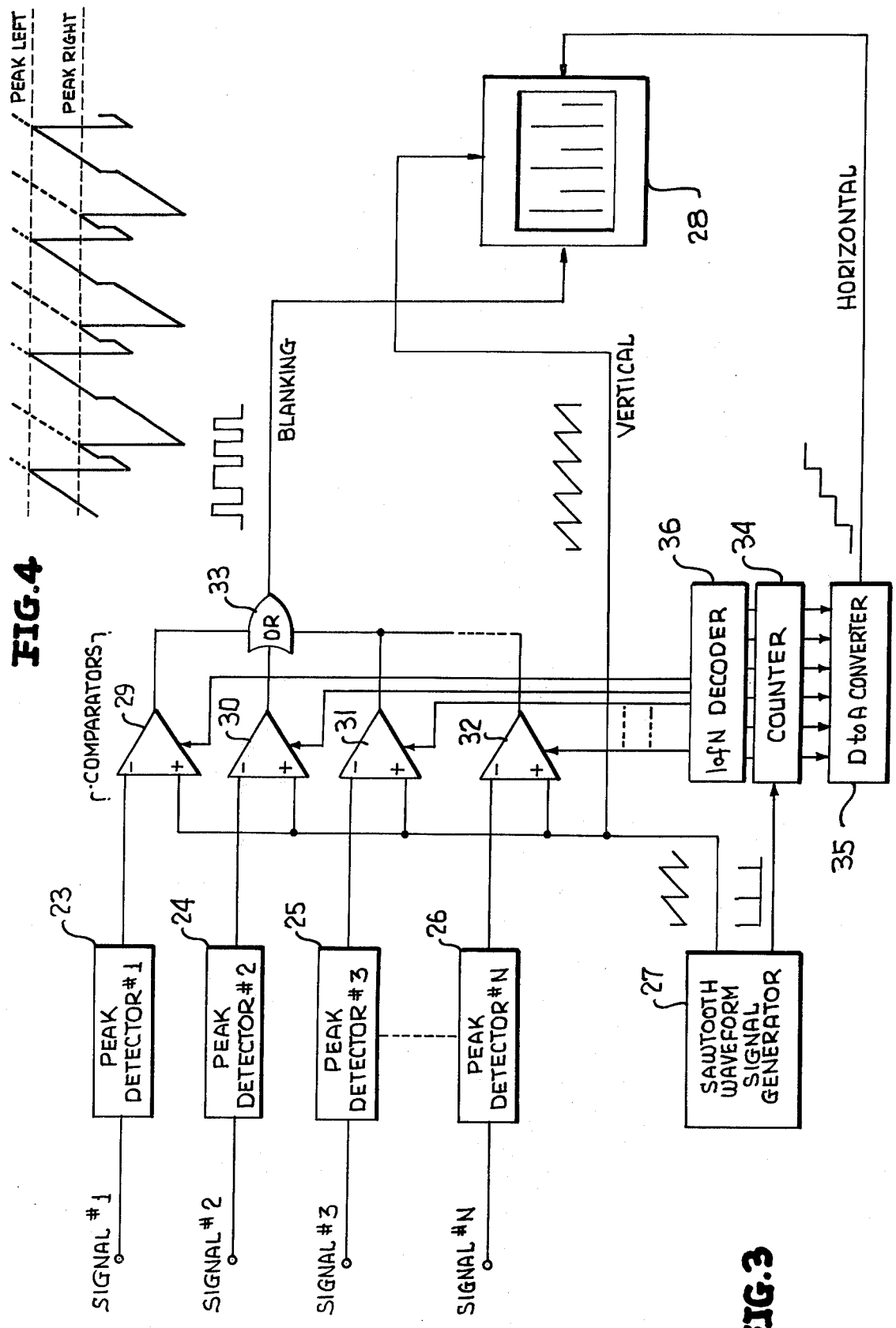

CATHODE RAY TUBE METERS

BACKGROUND OF THE INVENTION

This invention relates to cathode ray tube meters which provide visual representations of signal levels in plural signal channels. The invention relates, more particularly, to cathode ray tube meters which provide a plurality of visible, vertical traces on the screen of an oscilloscope, the length of each respective visible vertical trace representing signal level in an individual one of the signal channels.

It is often desirable to monitor the signal levels of a number of signal channels, particularly in multi-channel sound recording systems, multi-channel broadcast systems and, to a lesser extent, in multi-channel playback systems.

In most broadcast and sound recording studios, VU meters are used to set peak signal levels on lines which feed a broadcast transmitter, signal mixer or recorder. The conventional VU meters most often involve appropriately damped meter movements of the electromagnetic deflection type. The needle of the meter movement is deflected in proportion to the signal level. One meter must be provided for each channel in the event more than one channel is to be monitored simultaneously at any given time. In some instances, one conventional VU meter having an associated manually operated, selector switch may be provided, the position of the switch determining which channel is being monitored at any given time.

Arrangements of the type described above have a number of disadvantages. The size of the meter faces is such that it is difficult for a person monitoring a number of signal channels to have a good view of all meter faces at once. The meter movements often are not capable of following fast changes in signal level, due to the mechanical inertia of their moving parts.

SUMMARY OF THE INVENTION

It is an object of the present invention to provide a cathode ray tube meter which produces a number of visible traces on the screen of an oscilloscope, the length of each individual, visible trace being representative of the signal level in a respective one of a corresponding number of signal channels.

It is another object of the present invention to provide a cathode ray tube meter which displays simultaneously on the screen of an oscilloscope representations of the signal level in a number of signal channels for easy viewing.

It is an additional object of the present invention to provide a cathode ray tube meter which avoids problems of mechanical inertia.

The foregoing objects, as well as others which are to become clear from the text below, are accomplished in accordance with the present invention by providing a cathode ray tube meter which provides visible representation of signal levels in plural signal channels. The meter includes an oscilloscope having vertical and horizontal deflection circuits, and a screen on which respective visible traces representative of respective signal levels are to appear. Sweep signal generating circuits are provided for producing vertical and horizontal sweep signals which produce a given number of separate visible traces on the screen of the oscilloscope. One of the sweep circuits produces a sawtooth waveform signal. Circuitry responsive to the sawtooth waveform signal and to a number of d.c. signals individually representative of the signal levels in respective ones of plural signal channels establish the lengths of the visible traces on the screen of the oscilloscope to correspond to respective signal levels in each one of said plural channels.

BRIEF DESCRIPTION OF THE DRAWINGS

FIG. 1 is a block diagram of a first embodiment of a cathode ray tube meter according to the present invention, waveforms being shown to aid in understanding its operation.

FIG. 2 is a block diagram of a second embodiment of a cathode ray tube meter according to the present invention, waveforms being shown in the figure, and also in FIG. 4, to aid in understanding its operation.

FIG. 3 is a block diagram of a third embodiment of a cathode ray tube meter according to the present invention, a plurality of n signal channels being shown.

DETAILED DESCRIPTION OF THE PREFERRED EMBODIMENTS

As shown in FIG. 1, a cathode ray tube meter includes two audio channels which, as illustrated, constitute respectively the left channel audio signal and the right channel audio signal in a two channel audio system. The purpose of the circuit is to generate a pair of vertical visible traces on the face of an oscilloscope 10. The height of the left trace is directly proportional to the amplitude of the left channel audio signal and the height of the right trace is direclty proportional to the amplitude of the right channel audio signal. The face of the oscilloscope is provided with a VU scale.

The principal advantage of using an oscilloscope, such as the oscilloscope 10, is that there are no problems due to mechanical inertia. The traces can go up as fast as the audio signals, without a danger of overshooting.

A first peak detector 11 and a second peak detector 12 are arranged to receive, as respective inputs, the left channel audio signal and the right channel audio signal. Each of the peak detectors 11, 12 contains a conventional diode rectifier (not shown) and a load capacitor (not shown) across which appears a slowly varying d.c. signal substantially directly representative of the audio signal peaks.

A free running 1 KHZ sawtooth waveform signal generator 13 provides a continuous ramp signal which is fed to the vertical amplifier of the oscilloscope 10. Each time the sawtooth waveform signal reaches its peak value, it returns to zero and generates a sync pulse which clocks a flip-flop circuit 14 which has a Q output terminal and a Q̄ output terminal. Each time the sawtooth waveform signal retraces, the flip-flop circuit 14 changes state. The resulting square wave signal, which appears at the Q̄ terminal, is applied to the horizontal amplifier of the oscilloscope 10 and serves to place the vertical line on its screen either to the left or to the right of center. A line is thus traced alternatingly on the left and on the right side of the screen. As soon as a vertical sweep line is finished being traced on one side of the vertical center, the sawtooth vertical deflection signal returns the trace to the bottom of the screen and the square wave horizontal deflection signal moves the trace to the other side of the vertical center. Because this happens very quickly, the eye perceives that there are two stationary vertical lines. present.

The frequency of the sawtooth waveform signal generator 13 can be chosen to be whatever frequency is convenient; however, it is desirable to select frequency which is sufficiently high so that the pattern developed on the screen of the oscilloscope 10 does not flicker.

Two signal comparators 15, 16, which have enabling signal input terminals, are provided, the Q output square wave from the flip-flop circuit 14 being fed to the enable terminal of the comparator 16. The enable terminal of the comparator 15 is connected to the $\overline{Q}$ output terminal of the flip-flop circuit 14 and consequently, receives the same $\overline{Q}$ output square wave signal from the flip-flop 14 which produces the horizontal sweep for the oscilloscope 10.

Since the square wave signals from terminals Q and $\overline{Q}$ are of opposite phase, the flip-flop 14 serves to alternately enable the two signal comparators 15, 16. A first operational terminal of each of the signal comparators 15, 16 is connected to receive the sawtooth waveform signal from the waveform generator 13. A second operational terminal of the signal comparator 15 receives the d.c. signal from the peak detector 11. A second operational terminal of the signal comparator 16 is connected to receive the d.c. signal from the peak detector 12.

Each of the signal comparators 15, 16 compares the peak amplitude of either the left channel or right channel audio signal to the instantaneous amplitude of the sawtooth waveform signal received from the waveform generator 13. Whenever the amplitude of the sawtooth waveform signal is greater than the peak amplitude of the left channel audio signal, the output signal from the comparator 15, when enabled, goes from low to high. The high output signal from the comparator 15 passes through an OR circuit 17, as a blanking signal which is fed to the blanking input terminal of the oscilloscope 10. As a result, the upwardly moving, visible trace to the left of center on the screen of the oscilloscope 10 is blanked out for the remaining portion of its vertical extent. The length of the visible portion of this trace is directly proportional to the peak signal level in the left audio channel. The screen of the oscilloscope is as shown, desirably provided with a scale indexed in volume units.

The comparator 16 functions similarly to the comparator 15 producing an output signal which goes from low to high whenever it is both enabled and the sawtooth waveform signal from the waveform generator 13 exceeds the amplitude of the right channel audio signal. The high output signal from the comparator 16 is fed, via the OR circuit 17, to the blanking input terminal of the oscilloscope 10. The upwardly moving visible trace, now appearing to the right of the vertical center of the screen of the oscilloscope 10, becomes blanked out for the remaining portion of its vertical extent, the length of the still visible portion of this trace being direclty proportional to the peak signal level in the right audio channel.

The operations set out above are repeated over and over again as a result of the sync output from the waveform generator 13 clocking the flip-flop circuit 14 substantially upon the occurrence of a peak amplitude for the sawtooth waveform.

It is desirable always to see a small portion of the two vertical lines so that when the amplitude of the audio signal is zero, the screen will not be blank, but the screen should show zero level if in fact the audio level is zero. This can be accomplished by starting the sawtooth waveform signal below zero volts, so that when the audio signal is zero the sawtooth waveform signal, having started at a negative (below zero) point, will go up to the bottom or zero of the scale to provide a visible mark below the zero scale point.

An alternative to blanking the oscillocope when the peak has been reached is to quickly offset the sawtooth waveform signal below its normal starting point, as shown in FIG. 4. The visual effect will be the same, but this has the advantage of not requiring a blanking circuit. The patterns which appears on the screen of the oscilloscope 10 would be identical.

A cathode ray tube meter which provides visible representation of signal levels in plural signal channels using the alternative to blanking is shown in FIG. 2. As in the embodiment shown in FIG. 1, a first peak detector 11 and a second peak detector 12 receive respective audio inputs from the left audio channel and the right audio channel. Each of the peak detectors 11, 12 provides a respective slowly varying d.c. signal. These slowly varying d.c. signals, which correspond to the peak amplitudes of the audio signals are fed to different input terminals of an analog data selector 18. The analog data selector 18 acts as a single pole double throw switch, its output being connected to a first operational input terminal of a single signal comparator 19.

Switching input signals for the analog data selector 18 are provided from the Q and $\overline{Q}$ output connections of a flip-flop circuit 20 having its clock input connected to the output circuit of the signal comparator 19. A second operational input terminal of the signal comparator 19 is connected to receive a sawtooth wave form signal from a sawtooth waveform signal generator 21, this waveform signal also being coupled to the vertical sweep amplifier of an oscilloscope 22.

The $\overline{Q}$ output connection from the flip-flop circuit 20 is connected to the horizontal sweep amplifier of the oscilloscope 22.

The sawtooth waveform signal generator 21 is provided with a start input terminal which receives a 60 HZ start signal, and a reset input terminal which is connected to the output circuit of the signal comparator 19.

In operation, the sawtooth waveform signal generator 21 is started by the incoming 60 HZ signal and starts to generate a sawtooth waveform signal which is fed to the second input of the signal comparator 19 and to the vertical sweep amplifier of the oscilloscope 22. The analog data selector 18 passes the d.c. signal from the peak detector 11 to a first operational input of the comparator 19, its output, in turn, going from low to high whenever the amplitude of the sawtooth waveform signal received from the signal generator 21 exceeds the d.c. signal being passed by the analog data selector 18.

The high output signal from the comparator 19 clocks the flip-flop circuit 20 causing the analog data selector 18 to pass the d.c. signal from the peak detector 12 to the first operational input terminal of the comparator 19 instead of the d.c. signal from the peak detector 11. Since the $\overline{Q}$ rectangular waveform signal from the flip-flop circuit 20 is fed to the horizontal amplifier of the oscilloscope 22, the upwardly moving visible trace, which appears to the left of the vertical center of the face of the oscilloscope, is moved to the right side of the vertical center. At the same time, the high output signal from the comparator 19 resets the sawtooth waveform generator 21 to zero resulting in the moving of the trace to its lowest possible point on the face of the oscilloscope 22. The sawtooth generator 21 waits until it receives another start signal from the 60 HZ applied to its start input terminal.

The comparator 19 then compares the amplitude of the d.c. signal from the peak detector 12 with the instant amplitude of the sawtooth waveform signal from the signal generator 21, and again produces an output which goes from low to high when the sawtooth waveform signal exceeds the d.c. signal from the peak detector 12. As before, the sawtooth waveform generator 21 is reset, the vertical trace on the screen of the oscilloscope 22 is interrupted, the trace is moved to the other side of the vertical center of the screen and the operations described repeated.

A third embodiment of a cathode ray tube meter, which is shown in FIG. 3, is similar in many respects to that shown in FIG. 1. As shown in FIG. 3, the meter includes $n$ peak detectors 23–26 rather than only two, as shown in FIG. 1. A sawtooth waveform signal generator 27, which is identical to the generator 13 shown in FIG. 1 is provided for supplying the sync pulse and sawtooth waveform signals. The sawtooth waveform signal is fed to the vertical sweep amplifier of an oscilloscope 28 and to a first operational input terminal of each one of a plurality of n signal comparators 29–32, the second operational input terminals of these comparators being connected to respective output terminals of the peak detectors 23–26. The outputs from the comparators 29–32 are connected to inputs of an OR circuit 33 which supplies a blanking output signal to the oscilloscope 28.

A counter 34 is arranged to receive sync signal pulses from the generator 27, the counter providing a digital input to a digital-to-analog converter 35 which produces a step wave signal which is applied to the horizontal deflection amplifier of the oscilloscope 28, one step being provided for each of the signal channels to be monitored. The counter 34 also supplies binary signal outputs in parallel to a decoder 36 which, in turn, produces a series of enabling signals which are sequentially applied to respective enabling input terminals of the comparators 29–32.

Since the digital-to-analog converter 35 and the decoder 36 both are controlled by the counter 34, it is to be understood that one of the comparators 29–32 is enabled contemporaneously with the occurence of a corresponding step of the step wave which effects the horizontal deflection. Thus the plurality of vertical traces on the screen of the oscilloscope 28 correspond to respective ones of the signal channels. The partial blanking of the vertical traces occur in the same manner as in the embodiment of FIG. 1, the blanking signal being supplied via the OR circuit 33. The length of the individual visible portions of the traces appearing on the screen of the oscilloscope 28 correspond directly to signal levels in respective ones of the plural signal channels.

It is to be appreciated that the foregoing detailed description of the preferred embodiments has been given by way of example, not by way of limitation. Numerous other embodiments and variants are possible within the spirit and scope of the invention, the scope being defined in the appended claims.

What I claim is:

1. A cathode ray tube indicator system for displaying the amplitude of continuously varying peak audio signal levels which are in separate stereo channels, comprising
   a cathode ray tube,
   said cathode ray tube including vertical and horizontal deflection means, a source of a cathode ray, and a luminous display screen,
   plural stereo channels each conveying an audio signal,
   separate means for peak detecting each of said audio signals to provide peak voltages,
   said vertical deflection means including means for sequentially sweeping said cathode ray vertically at least to a vertical position representative of the magnitude of each of said peak voltages, said vertical deflection means also including means for extending said vertical sweeps to finite values when said peak voltages have zero magnitudes,
   said horizontal deflection means including means for sequentially displacing said cathode ray recurrently horizontally to a plurality of fixed horizontal locations representative respectively of the identities of said stereo channels, and
   means for synchronizing said vertical deflection means and said horizontal deflection means such that each vertical sweep occurs at only one of said fixed horizontal locations.

2. The combination according to claim 1 wherein said vertical deflection means includes a source of sawtooth sweep voltage operative to complete each vertical sweep in the same predetermined time interval, comparator means for comparing the amplitudes of each of said peak voltages and of said sawtooth sweep voltage, and means responsive to an output of said comparator means for blanking said cathode ray.

3. The combination according to claim 1 wherein said vertical deflection means includes a source of sawtooth sweep voltage, a plurality of separate comparator means coupled respectively to said separate peak detecting means for comparing the amplitudes of said peak voltages in said plural stereo channels respectively with the instantaneous magnitude of said sawtooth sweep voltage, means for enabling different individual ones of said comparator means at different times, and means responsive to an output of an enabled one of said comparator means for controlling the length of the visible trace produced on said display screen during a corresponding one of said vertical sweeps.

4. A system for displaying the peak voltages of multichannel left and right stereophonic audio signals, comprising,
   a cathode ray tube including a luminescent face and first and second ray deflection means for deflecting the ray in said tube vertically and horizontally respectively across said luminescent face,
   left and right stereophonic audio channels,
   separate means responsive to said audio signals in each of said audio channels for providing separate voltages representative of the peak audio signal level in each of said channels,
   means for producing separated vertical visual traces on said luminescent face having lengths which are functions of said voltages, respectively, and both extending in one of said vertical and horizontal directions, said last-named means including means for providing a visual trace of predetermined finite value when said voltage is zero, and means for displacing said visual traces recurrently in opposite senses horizontally as a function of the identity of said separate means providing said voltages.

5. A cathode ray tube indicator system for displaying the amplitudes of continuously varying peak audio signal levels which are in separate stereo channels comprising a cathode ray tube, said cathode ray tube including vertical and horizontal deflection means, a source of a cathode ray, and a luminous display screen, plural stereo channels each conveying audio signal, means for peak detecting each of said audio signals to provide peak voltages, said vertical deflection means including sweep control means for sequentially sweeping said cathode ray vertically at least to a vertical position representative of each of said peak voltages, said sweep control means including a source of sawtooth sweep voltage, comparator means for comparing the amplitudes of said peak voltages and of said sawtooth sweep voltage, and means responsive to an output of said comparator means for terminating a concurrent vertical sweep and initiating a further vertical sweep, said horizontal deflection means including means for sequentially and recurrently displacing said cathode ray horizontally to a plurality of fixed horizontal locations representative of the identities of said stereo channels, and means for synchronizing said vertical deflection means and said horizontal deflection means such that each vertical sweep occurs at only one of said fixed horizontal locations.

6. The combination of claim 5 including means for extending said vertical sweeps to finite values during zero values of said peak voltages.

7. The combination of claim 3 wherein said enabling means comprises signal generator means having a plurality of output terminals which are coupled respectively to enabling control inputs of said plurality of comparator means, and means responsive to said sawtooth sweep voltage for producing timing signals operative to cause said signal generator means to produce an enabling control signal at different ones of said terminals in a predetermined sequence.

8. The combination of claim 7 wherein said signal generator means comprises a flip-flop.

9. The combination of claim 7 wherein said signal generator means comprises a counter.

* * * * *